US012685173B2

(12) United States Patent
Chiu et al.

(10) Patent No.: US 12,685,173 B2
(45) Date of Patent: Jul. 14, 2026

(54) ELECTRONIC PACKAGE AND SHIELDING PART INCLUDING SEMICONDUCTOR BLOCK AND MAGNETIZED LAYER

(71) Applicant: SILICONWARE PRECISION INDUSTRIES CO., LTD., Taichung (TW)

(72) Inventors: Chih-Hsien Chiu, Taichung (TW); Wen-Jung Tsai, Taichung (TW); Ko-Wei Chang, Taichung (TW); Jyun-Hao Yang, Taichung (TW); Chia-Yang Chen, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 593 days.

(21) Appl. No.: 18/298,450

(22) Filed: Apr. 11, 2023

(65) Prior Publication Data

US 2024/0203900 A1     Jun. 20, 2024

(30) Foreign Application Priority Data

Dec. 20, 2022     (TW) .................................. 111149016

(51) Int. Cl.
| | |
|---|---|
| *H10W 42/20* | (2026.01) |
| *H10B 80/00* | (2026.01) |

(Continued)

(52) U.S. Cl.
CPC ............ *H10W 42/20* (2026.01); *H10B 80/00* (2023.02); *H10W 72/073* (2026.01);
(Continued)

(58) Field of Classification Search
CPC ... H01L 2225/06506; H01L 2225/0651; H01L 2224/92247; H01L 2224/73215; H01L 2224/73265; H01L 24/16; H01L 24/29; H01L 24/32; H01L 24/33; H01L 24/83; H01L 2224/16227; H10B 80/00; H10W 42/20; H10W 72/884; H10W 72/30; H10W 72/073; H10W 90/731; H10W 72/865;

(Continued)

(56) References Cited

U.S. PATENT DOCUMENTS

| | | | | |
|---|---|---|---|---|
| 2013/0256819 A1* | 10/2013 | Watanabe | ............. | H01L 23/295 |
| | | | | 257/422 |
| 2015/0243607 A1* | 8/2015 | Jang | ...................... | H01L 23/552 |
| | | | | 438/113 |
| 2016/0093795 A1* | 3/2016 | Arai | ...................... | H01L 23/552 |
| | | | | 257/422 |

* cited by examiner

*Primary Examiner* — Didarul A Mazumder
(74) *Attorney, Agent, or Firm* — Studebaker Brackett PLLC

(57) ABSTRACT

An electronic package is provided, in which a first shielding part bonded with a first electronic component are disposed on a carrier structure, and the first electronic component and the first shielding part are covered by an encapsulation layer. The first shielding part includes a semiconductor block and a magnetized layer formed on the semiconductor block, and the first shielding part is bonded to the first electronic component, such that the semiconductor block separates the magnetized layer and the first electronic component. Therefore, a distance defined by a thickness of a single semiconductor block is maintained between the magnetized layer and the first electronic component, thereby preventing a magnetic field operation of the first electronic component from being interfered by a magnetic field of the magnetized layer.

9 Claims, 10 Drawing Sheets

(51) Int. Cl.
    H10W 72/00     (2026.01)
    H10W 72/30     (2026.01)
    H10W 90/00     (2026.01)

(52) U.S. Cl.
    CPC .... *H10W 72/07354* (2026.01); *H10W 72/075* (2026.01); *H10W 72/07554* (2026.01); *H10W 72/347* (2026.01); *H10W 72/865* (2026.01); *H10W 72/877* (2026.01); *H10W 72/884* (2026.01); *H10W 90/724* (2026.01); *H10W 90/731* (2026.01); *H10W 90/734* (2026.01); *H10W 90/754* (2026.01)

(58) Field of Classification Search
    CPC . H10W 72/20; H10W 72/877; H10W 90/752; H10W 90/724; H10W 90/734; H10W 90/754
    USPC ................................................ 257/99; 438/22
    See application file for complete search history.

ELECTRONIC PACKAGE AND SHIELDING PART INCLUDING SEMICONDUCTOR BLOCK AND MAGNETIZED LAYER

BACKGROUND

1. Technical Field

The present disclosure relates to a semiconductor packaging process, and more particularly, to an electronic package and manufacturing method thereof with a shielding mechanism.

2. Description of Related Art

With the evolution of semiconductor technology, various semiconductor products have a function of shielding to prevent electromagnetic interference (EMI) in order to improve electrical quality.

As shown in FIG. 1, in a conventional semiconductor package 1, a semiconductor chip 11 is disposed on a packaging substrate 10, the semiconductor chip 11 is covered by an encapsulation colloid 15, and a shielding layer 19 made of metal material is formed on the outer surface of the encapsulation colloid 15 and the side surfaces of the packaging substrate 10, so that the semiconductor chip 11 is protected from the interference of external EMI by the shielding layer 19.

As the product application changes, the demand for magneto-resistive chips such as Magneto-resistive Random Access Memory (MRAM) is gradually increasing. Hence, the semiconductor chip 11 is adopted as a magneto-resistive chip.

However, in the conventional semiconductor package 1, the shielding layer 19 cannot effectively protect the semiconductor chip 11 from magnetic field interference, so the reliability of the semiconductor package 1 is poor.

Therefore, how to overcome the aforementioned drawbacks of the prior art has become an urgent issue to be addressed at present.

SUMMARY

In view of the various shortcomings of the prior art, the present disclosure provides an electronic package, comprising: a carrier structure; an encapsulation layer formed on the carrier structure; a first shielding part embedded in the encapsulation layer, wherein the first shielding part includes a semiconductor block and a magnetized layer formed on one side of the semiconductor block; and a first electronic component embedded in the encapsulation layer and disposed on other side of the first shielding part, wherein the first electronic component is electrically connected to the carrier structure.

The present disclosure also provides a method of manufacturing an electronic package, comprising: disposing a first shielding part bonded with a first electronic component on a carrier structure, wherein the first shielding part includes a semiconductor block and a magnetized layer formed on one side of the semiconductor block, wherein the first electronic component is disposed on other side of the first shielding part, and the first electronic component is electrically connected to the carrier structure; and forming an encapsulation layer on the carrier structure, wherein the first electronic component and the first shielding part are covered by the encapsulation layer.

In the aforementioned electronic package and method, the first shielding part further comprises a bonding layer formed on the other side of the semiconductor block, and the first electronic component is bonded to the bonding layer. For instance, the bonding layer of the first shielding part is disposed on the other side of the semiconductor block first, and then the first electronic component is bonded to the bonding layer. Alternatively, the bonding layer is formed on the first electronic component first, and then the bonding layer is bonded to the other side of the semiconductor block of the first shielding part.

In the aforementioned electronic package and method, the first shielding part is disposed on the carrier structure via a side of the magnetized layer of the first shielding part, and the first shielding part is located between the first electronic component and the carrier structure.

In the aforementioned electronic package and method, the first electronic component is disposed on the carrier structure, and the first electronic component is located between the first shielding part and the carrier structure.

In the aforementioned electronic package and method, the present disclosure further comprises disposing a second shielding part on the first electronic component, wherein the second shielding part includes a semiconductor block and a magnetized layer formed on one side of the semiconductor block, wherein the second shielding part is disposed on the first electronic component via other side of the second shielding part, and the first electronic component is located between the first shielding part and the second shielding part. For instance, the first electronic component is electrically connected to the carrier structure via a plurality of wires, and the second shielding part includes a bonding layer on the other side of the second shielding part, wherein the bonding layer is bonded to the first electronic component and covers parts of the wires. Further, the other side of the first shielding part and/or the other side of the second shielding part have a bonding layer, and the magnetized layer is formed between the semiconductor block and the bonding layer. Alternatively, a top surface of the encapsulation layer is flush with a surface of the magnetized layer of the second shielding part. Or, the present disclosure further comprises forming at least one recess on the encapsulation layer, wherein a portion of a surface of the magnetized layer of the second shielding part is exposed from the recess. Further, a plurality of the second shielding parts are disposed on the first electronic component.

In the aforementioned electronic package and method, the present disclosure further comprises forming a shielding layer on the encapsulation layer.

In the aforementioned electronic package and method, a plurality of the first shielding parts are disposed on the carrier structure.

In the aforementioned electronic package and method, the present disclosure further comprises embedding a second electronic component in the encapsulation layer, wherein the first shielding part is disposed on the second electronic component via the magnetized layer of the first shielding part, wherein the first electronic component and the second electronic component are disposed on the opposing sides of the semiconductor block of the first shielding part respectively, wherein the second electronic component is located between the carrier structure and the first shielding part, and the second electronic component is electrically connected to the carrier structure.

As can be seen from the above, in the electronic package of the present disclosure and manufacturing method thereof, the shielding part is bonded to the first electronic component and protects the first electronic component in a close distance, and the semiconductor block separates the magnetized layer and the first electronic component, such that the first shielding part can prevent the first electronic component from being interfered by the external electromagnetic interference. Further, since the distance defined by the thickness of the single semiconductor block is maintained between the magnetized layer and the first electronic component, the magnetic field operation of the first electronic component can be prevented from being interfered by the magnetic field of the magnetized layer. Hence, compared to the prior art, the reliability of the electronic package of the present disclosure can be improved.

BRIEF DESCRIPTION OF THE DRAWINGS

FIG. 2A-1, FIG. 2B, FIG. 2C-1, FIG. 2D, FIG. 2E, FIG. 2F and FIG. 2G-1 are schematic cross-sectional views illustrating a method of manufacturing an electronic package according to the present disclosure.

FIG. 2A-2 is a schematic cross-sectional view showing another embodiment of FIG. 2A-1.

FIG. 2C-2 is a schematic cross-sectional view showing another embodiment of FIG. 2C-1.

FIG. 2G-2 and FIG. 2G-3 are schematic cross-sectional views showing other different aspects of FIG. 2G-1.

FIG. 2H-1 is a schematic cross-sectional view showing another aspect of FIG. 2G-1.

FIG. 2H-2 is a schematic cross-sectional view showing subsequent process of FIG. 2A-2.

DETAILED DESCRIPTION

Figure 1:
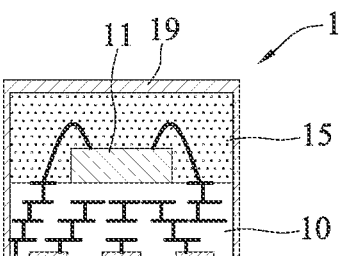
FIG. 1 is a schematic cross-sectional view of a conventional semiconductor package.

The following describes the implementation of the present disclosure with examples. Those familiar with the art can easily understand the other advantages and effects of the present disclosure from the content disclosed in this specification.

It should be noted that the structures, ratios, sizes, etc. shown in the drawings appended to this specification are to be construed in conjunction with the disclosure of this specification in order to facilitate understanding of those skilled in the art. They are not meant to limit the implementations of the present disclosure, and therefore have no substantial technical meaning. Any modifications of the structures, changes of the ratio relationships, or adjustments of the sizes, are to be construed as falling within the range covered by the technical content disclosed herein to the extent of not causing changes in the technical effects created and the objectives achieved by the present disclosure. Meanwhile, terms such as "on," "first," "second," "one," "a," and the like recited herein are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

FIG. 2A-1, FIG. 2B, FIG. 2C-1, FIG. 2D, FIG. 2E, FIG. 2F and FIG. 2G-1 are schematic cross-sectional views illustrating a method of manufacturing an electronic package 2 according to the present disclosure.

Figures 1, 2A:
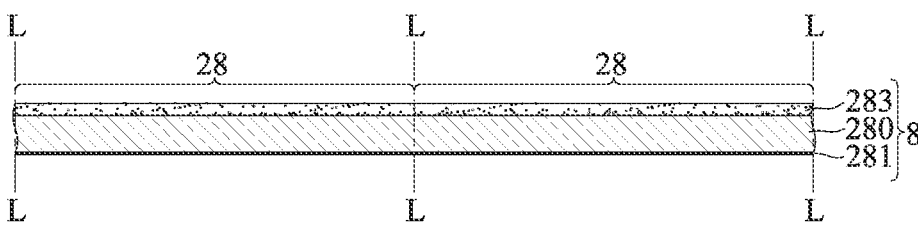

As shown in FIG. 2A-1, a shielding structure 8 comprising a plurality of shielding parts 28 is provided. The shielding part 28 includes a semiconductor block 280 and a magnetized layer 281 formed on one side of the semiconductor block 280. A bonding layer 283 can be formed on the other side of the semiconductor block 280 according to requirements, so the magnetized layer 281 and the bonding layer 283 are disposed on opposing sides of the semiconductor block 280 respectively.

In an embodiment, the shielding structure 8 is of a wafer form and comprises a plurality of silicon chips to serve as the semiconductor block 280. For instance, the semiconductor block 280 is a dummy die without electrical transmission function.

Moreover, the material forming the magnetized layer 281 is such as iron (Fe), nickel (Ni), cobalt (Co), nickel-iron alloy (Ni/Fe), silicon steel (Si steel), or other magnetized materials with high magnetic permeability. The bonding layer 283 is made of an adhesive material such as film-type adhesive tape. For instance, in the manufacturing process of the shielding structure 8, the magnetized layer 281 is coated on one side of a wafer first, and then the bonding layer 283 is coated on the other side of the wafer.

Furthermore, in the shielding part 28, the magnetized layer 281 can be coated on one side of the semiconductor block 280 according to requirements. Then, another magnetized layer 282 is coated on the other side of the semiconductor block 280, as shown in a shielding structure 8a of FIG. 2A-2. Next, the bonding layer 283 is coated on the another magnetized layer 282, so the another magnetized layer 282 is formed between the semiconductor block 280 and the bonding layer 283.

Figures 2, 2A:
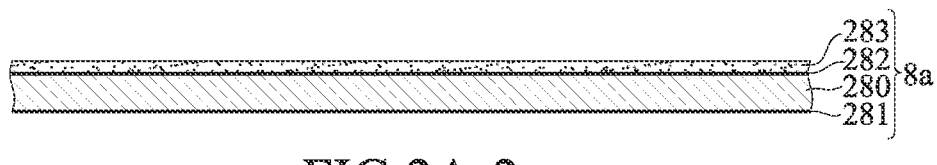
Figure 2B:
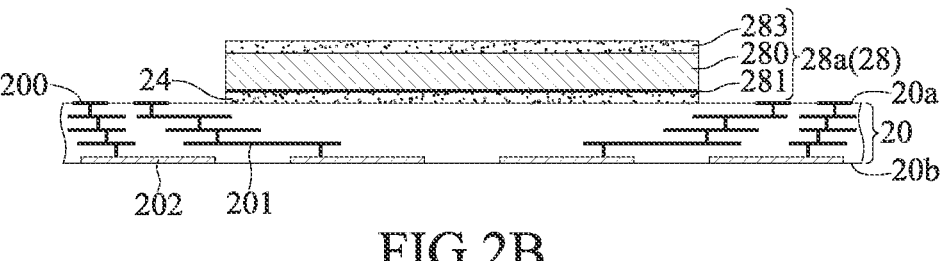

As shown in FIG. 2B, subsequent to the manufacturing process shown in FIG. 2A-1, a singulation process is performed along cutting paths L shown in FIG. 2A-1 to obtain a plurality of the shielding parts 28, and at least one shielding part 28 is defined as a first shielding part 28a, such that the first shielding part 28a is disposed on a carrier structure 20 via the magnetized layer 281 of the first shielding part 28a.

In an embodiment, the carrier structure 20 is for example a packaging substrate with a core layer and a circuit structure or a coreless circuit structure, and circuit layers 200, 201, 202 such as fan-out redistribution layer (RDL) are formed on an insulating material. For instance, the material for forming the circuit layers 200, 201, 202 is copper, and the insulating material is a dielectric material such as polybenzoxazole (PBO), polyimide (PI), prepreg (PP), or the like, or a solder-resist material such as solder mask (e.g., green paint), graphite (e.g., ink), or the like. It can be understood that the carrier structure 20 can also be other plates for carrying chips, such as a wafer or other plates with metal routings, but the present disclosure is not limited to as such.

Moreover, the carrier structure 20 is defined with a first side 20a and a second side 20b opposing the first side 20a, such that the first shielding part 28a is disposed on the first side 20a of the carrier structure 20.

Additionally, the magnetized layer 281 of the first shielding part 28a is arranged on the first side 20a of the carrier structure 20 via an adhesive layer 24. For instance, the adhesive layer 24 can be formed on the first side 20a of the carrier structure 20. Alternatively, the adhesive layer 24 can be formed on the magnetized layer 281 of the shielding structure 8 first, and then the singulation process is performed along the cutting paths L shown in FIG. 2A-1 to obtain the plurality of shielding parts 28 having the adhesive layer 24.

Figures 1, 2C:
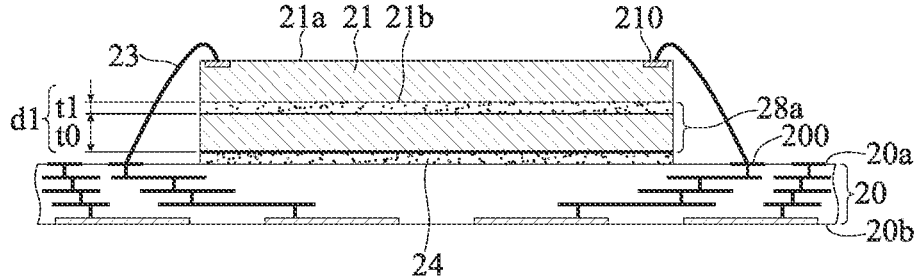
Figures 2, 2C:
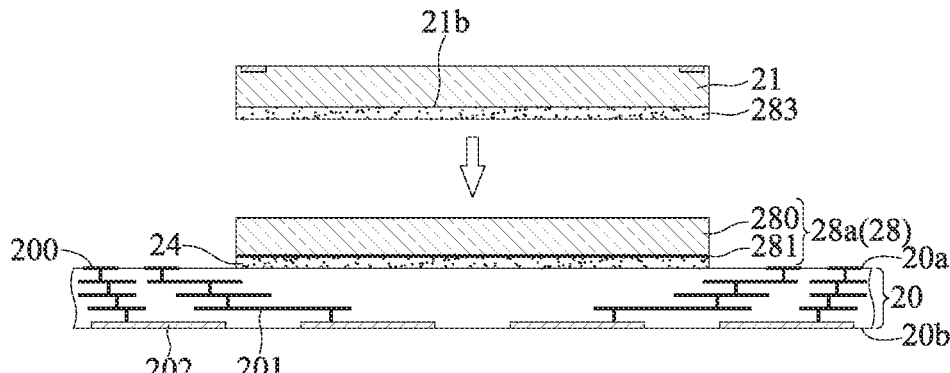

As shown in FIG. 2C-1, at least one first electronic component 21 is disposed on the bonding layer 283 of the first shielding part 28a, such that the combination of the first shielding part 28a and the first electronic component 21 is disposed on the carrier structure 20, and the first electronic component 21 is electrically connected to the circuit layer 200 on the first side 20a of the carrier structure 20.

In an embodiment, the first electronic component 21 is an active component, a passive component, or a combination of the active component and the passive component, etc., wherein the active component is for example a semiconductor chip, and the passive component is for example a resistor, a capacitor, or an inductor. For instance, the first electronic component 21 is a magneto-resistive semiconductor chip such as a magneto-resistive random access memory (MRAM), and the first electronic component 21 can be electrically connected to the circuit layer 200 on the first side 20a of the carrier structure 20 by wire bonding (e.g., wires 23 as shown in FIG. 2C-1), flip chip, directly contacting the circuit layer 200, or other suitable ways without any special limitations.

In addition, the first electronic component 21 has a first surface 21a and a second surface 21b opposing the first surface 21a, such that the first electronic component 21 is bonded onto the bonding layer 283 of the first shielding part 28a via the second surface 21b of the first electronic component 21. In an embodiment, the first electronic component 21 is electrically connected to the carrier structure 20 by wire bonding, such that the first surface 21a is defined as an active surface, and the second surface 21b is defined as an inactive surface, so a plurality of electrode pads 210 are formed on the first surface 21a for connecting the wires 23.

Furthermore, the bonding layer 283 is first formed on the other side of the semiconductor block 280 in the first shielding part 28a, and then the first electronic component 21 is bonded to the bonding layer 283. Alternatively, as shown in FIG. 2C-2, the bonding layer 283 can be formed on the second surface 21b of the first electronic component 21 first, and then the bonding layer 283 is bonded to the other side of the semiconductor block 280 of the first shielding part 28a; or, the bonding layer 283 can be coated on the other side of the semiconductor block 280 by dispensing, and then the first electronic component 21 is bonded to the bonding layer 283 (not shown).

Moreover, a distance d1 between the magnetized layer 281 of the first shielding part 28a and the first electronic component 21 (i.e., the distance d1 is the sum of a thickness t0 of the semiconductor block 280 of the first shielding part 28a and a thickness t1 of the bonding layer 283) is less than or equal to 75 μm.

Figures 2D, 2E:
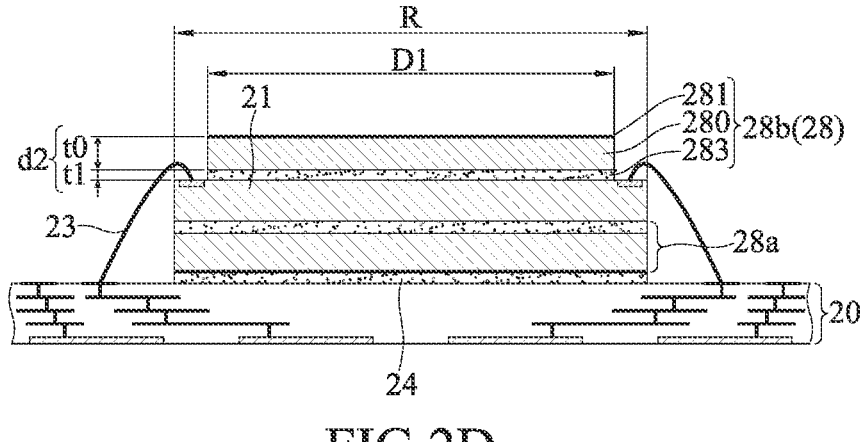

As shown in FIG. 2D, at least one of the other of the plurality of shielding parts 28 is defined as a second shielding part 28b, and the second shielding part 28b is disposed on the first surface 21a of the first electronic component 21 via the bonding layer 283 of the second shielding part 28b, so that the first shielding part 28a and the second shielding part 28b can prevent the first electronic component 21 from being interfered by the external electromagnetic interference.

In an embodiment, a width D1 of the second shielding part 28b is less than a width R of the first electronic component 21, so that the second shielding part 28b (the semiconductor block 280) can be prevented from being in contact with the wires 23.

Figure 2F:
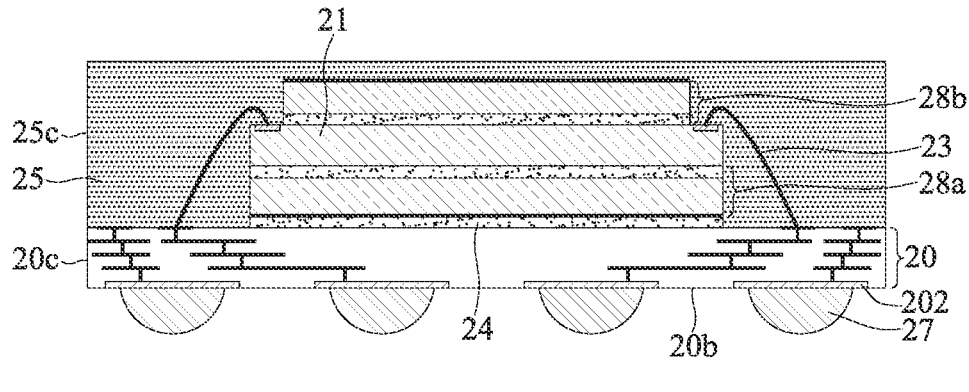
Figures 1, 2G:
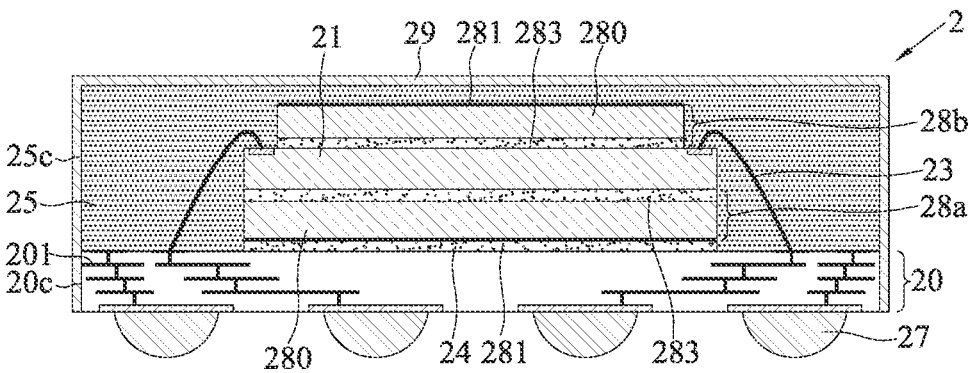
Figures 2, 2G:
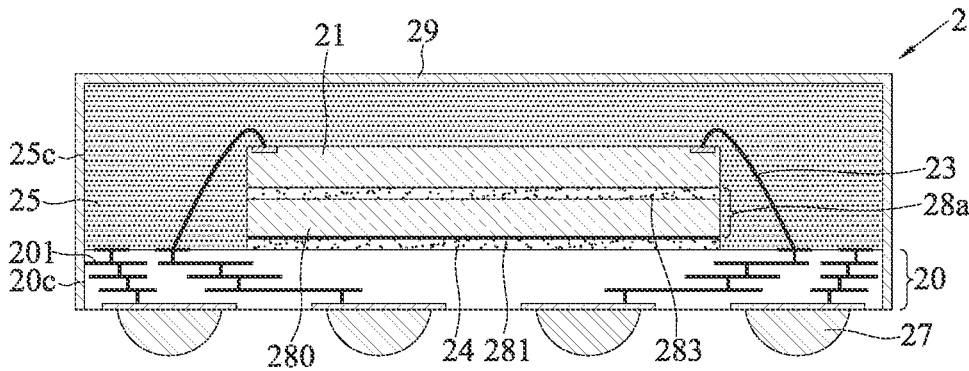
Figures 2, 2G, 3:
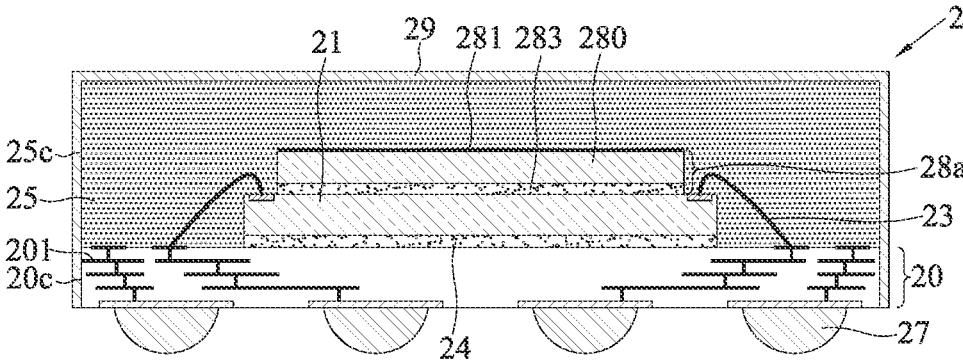
Figures 1, 2H:
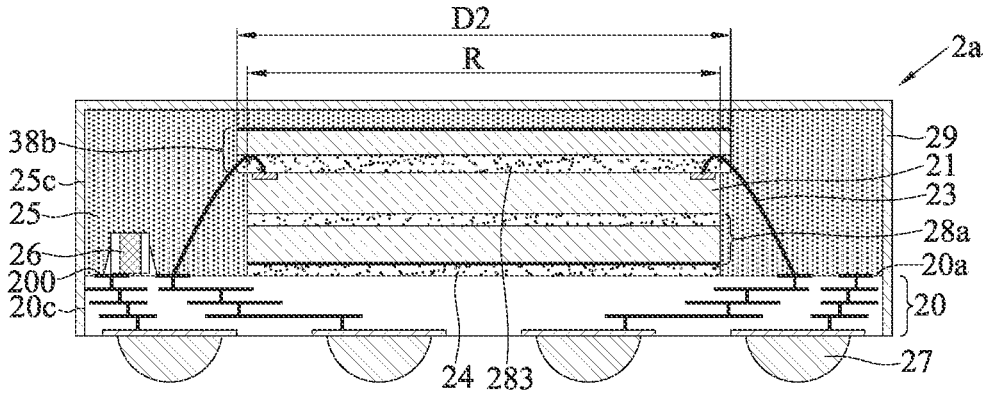
Figures 2, 2H:
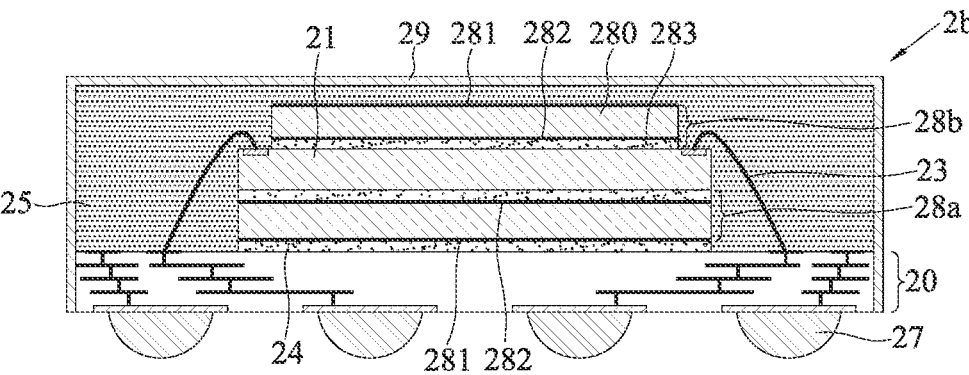

Moreover, as shown in FIG. 2H-1, the bonding layer 283 can cover a portion of the wire 23 by film-over-wire (FOW). Therefore, a width D2 of a second shielding part 38b can be greater than or equal to the width R of the first electronic component 21.

Furthermore, a distance d2 between the magnetized layer 281 of the second shielding part 28b and the first electronic component 21 (i.e., the distance d2 is the sum of the thickness t0 of the semiconductor block 280 of the second shielding part 28b and the thickness t1 of the bonding layer 283) is less than or equal to 75 μm.

As shown in FIG. 2E, an encapsulation layer 25 is formed on the first side 20a of the carrier structure 20, so that the first electronic component 21, the wires 23, the adhesive layer 24, the first shielding part 28a and the second shielding part 28b are covered by the encapsulation layer 25.

In an embodiment, the encapsulation layer 25 is made of an insulating material such as polyimide (PI), dry film, encapsulation colloid such as epoxy resin, or molding compound, but the present disclosure is not limited to as such. The encapsulation layer 25 can be formed on the first side 20a of the carrier structure 20 by lamination or compression molding.

Figure 3A:
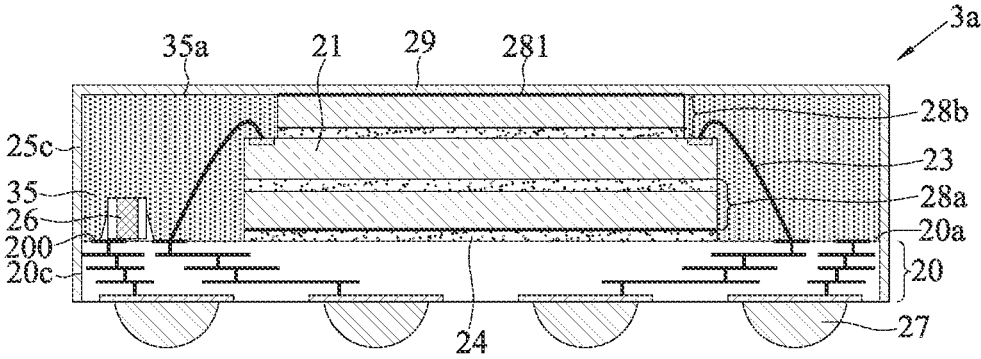
FIG. 3A and FIG. 3B are schematic cross-sectional views showing different embodiments of FIG. 2G-1.

In addition, the second shielding part 28b is embedded in the encapsulation layer 25 and free from being exposed from a top surface 25a of the encapsulation layer 25. Alternatively, as shown in FIG. 3A, a top surface 35a of an encapsulation layer 35 can be flush with the outer surface of the magnetized layer 281 of the second shielding part 28b by a leveling process such as grinding, so that the magnetized layer 281 of the second shielding part 28b is exposed from the encapsulation layer 35.

Figure 3B:
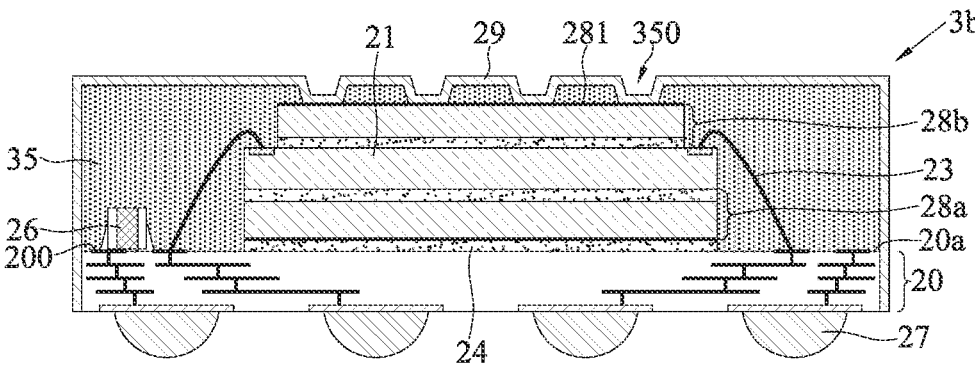

Moreover, as shown in FIG. 3B, in another embodiment, at least one recess 350 can be formed on the encapsulation layer 35, so that at least a portion of the surface of the magnetized layer 281 of the second shielding part 28b is exposed from the recess 350.

As shown in FIG. 2F, a plurality of conductive components 27 are formed on the second side 20b of the carrier structure 20, then a singulation process is performed along cutting paths S shown in FIG. 2E to define side surfaces 25c of the encapsulation layer 25 and side surfaces 20c of the carrier structure 20.

In an embodiment, the conductive components 27 are in the form of solder balls, metal pillars, or other contacts and are electrically connected to the circuit layer 202 on the second side 20b of the carrier structure 20, such that the subsequently obtained electronic package 2 can be connected to an electronic device such as a circuit board (not shown) via the plurality of conductive components 27.

As shown in FIG. 2G-1, a shielding layer 29 is formed on the encapsulation layer 25 (e.g., the shielding layer 29 is formed on the top surface 25a of the encapsulation layer 25 and/or the side surfaces 25c of the encapsulation layer 25) to shield the first electronic component 21 so as to obtain the electronic package 2 of the present disclosure.

In an embodiment, the shielding layer 29 can extend onto the side surfaces 20c of the carrier structure 20 according to requirements, and the shielding layer 29 is free from being formed on the second side 20b of the carrier structure 20. For instance, the shielding layer 29 such as a metal layer can be formed by sputtering, evaporation, electroplating, chemical plating (electroless plating), or foiling, etc., and the present disclosure is not limited to as such.

Furthermore, the shielding layer 29 can be grounded to the carrier structure 20. For instance, the shielding layer 29 is grounded to the circuit layer 201 exposed on the side surface 20c of the carrier structure 20. It can be understood that there are various ways for the shielding layer 29 to ground the carrier structure 20, and the present disclosure is not limited to as such.

In addition, an electronic package 2a shown in FIG. 2H-1 can be obtained if the second shielding part 28b is arranged by film-over-wire (FOW). It should be understood that an electronic package 2b as shown in FIG. 2H-2 can be obtained if the process shown in FIG. 2A-2 is continued, such that the another magnetized layer 282 of the first shielding part 28a is formed between the semiconductor block 280 and the bonding layer 283 (and/or the another magnetized layer 282 of the second shielding part 28b is formed between the semiconductor block 280 and the bonding layer 283), so that the first shielding part 28a and/or the second shielding part 28b have multiple magnetized layers 281, 282.

Moreover, if the second shielding part 28b is exposed from the encapsulation layer 35, as shown in an electronic package 3a of FIG. 3A, then the shielding layer 29 is in contact with the magnetized layer 281 of the second shielding part 28b; alternatively, as shown in an electronic package 3b of FIG. 3B, the shielding layer 29 extends into the recess 350 to contact the magnetized layer 281 of the second shielding part 28b.

Therefore, in the manufacturing method of the present disclosure, the shielding part 28 is bonded to the first electronic component 21, so that the semiconductor block 280 separates the magnetized layer 281 and the first electronic component 21 (having magnetic field operation), such that the shielding part 28 can prevent the first electronic component 21 from being interfered by the external electromagnetic interference. Further, since the distance d1, d2 (at most 75 μm) defined by the thickness t0 of the single semiconductor block 280 (dummy chip) is maintained between the magnetized layer 281 and the first electronic component 21, the magnetic field operation of the first electronic component 21 can be prevented from being interfered by the magnetic field of the magnetized layer 281. Hence, compared to the prior art, the reliability of the electronic package 2, 2a, 2b, 3a, 3b of the present disclosure can be improved.

It can be understood that the shielding part 28 can also be selected to be only bonded on one surface of the first electronic component 21. For instance, in an embodiment, the first shielding part 28a is disposed on the carrier structure 20 via the side of the magnetized layer 281 of the first shielding part 28a, and the first electronic component 21 is disposed on the first shielding part 28a, so that the first shielding part 28a is located between the first electronic component 21 and the carrier structure 20, as shown in FIG. 2G-2; in another embodiment, the first electronic component 21 is disposed on the carrier structure 20, and the first shielding part 28a is disposed on the first electronic component 21, so that the first electronic component 21 is located between the first shielding part 28a and the carrier structure 20, as shown in FIG. 2G-3.

Furthermore, the circuit layer 200 on the first side 20a of the carrier structure 20 can be electrically connected to at least one passive component 26 according to requirements, as shown in FIG. 2H-1, FIG. 3A and FIG. 3B.

Figure 4A:
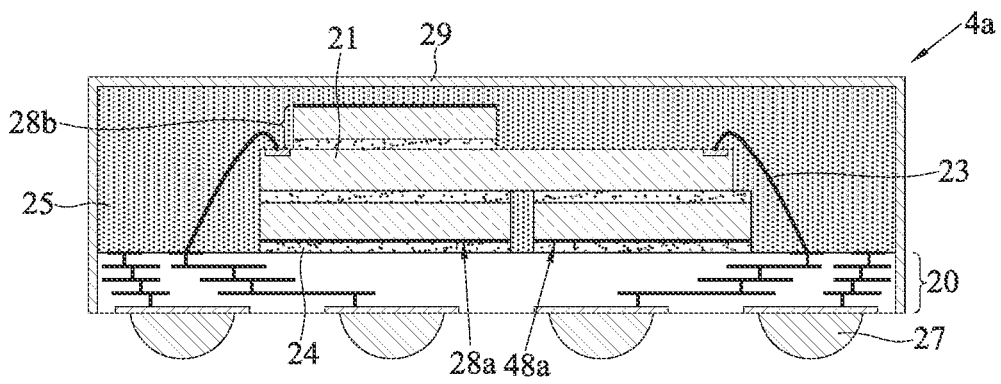
FIG. 4A and FIG. 4B are schematic cross-sectional views showing different embodiments of FIG. 2H-1.
Figure 4B:
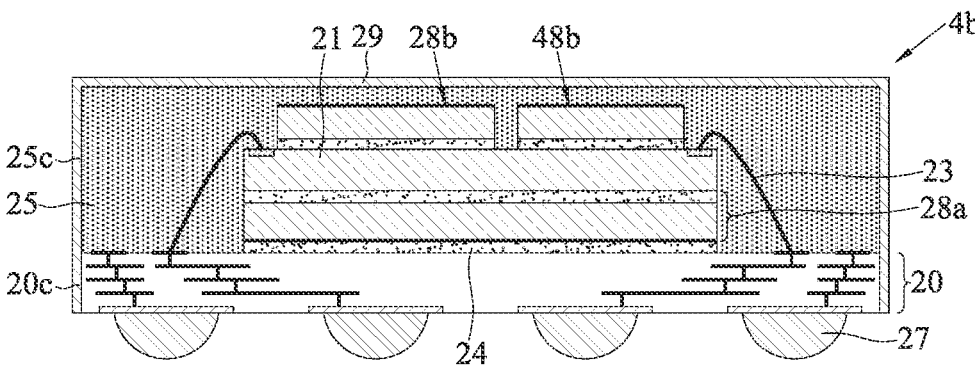

In addition, as shown in an electronic package 4a of FIG. 4A, the first electronic component 21 can be carried via a plurality of first shielding parts 28a, 48a, that is, the second surface 21b of the first electronic component 21 is bonded to the plurality of first shielding parts 28a, 48a; it can be understood that, as shown in an electronic package 4b of FIG. 4B, a plurality of second shielding parts 28b, 48b can also be disposed on the first surface 21a of the first electronic component 21 according to requirements.

Figure 5A:
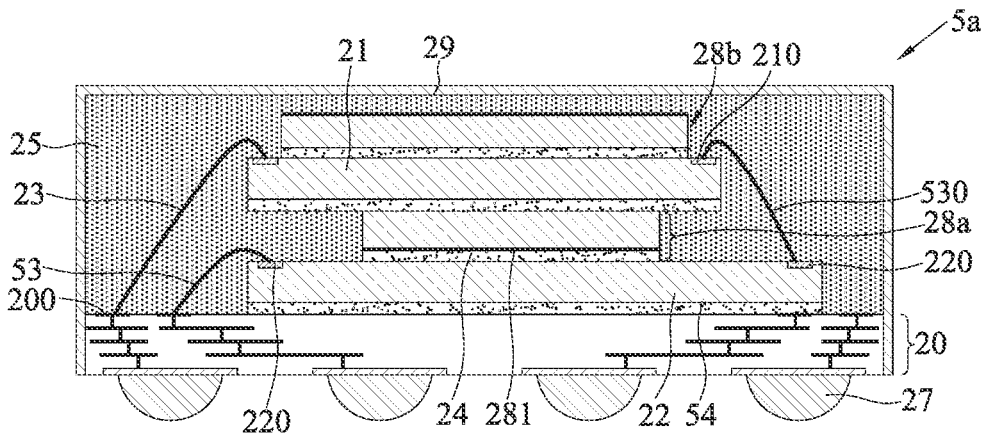
FIG. 5A and FIG. 5B are schematic cross-sectional views showing other embodiments of FIG. 2H-1.
Figure 5B:
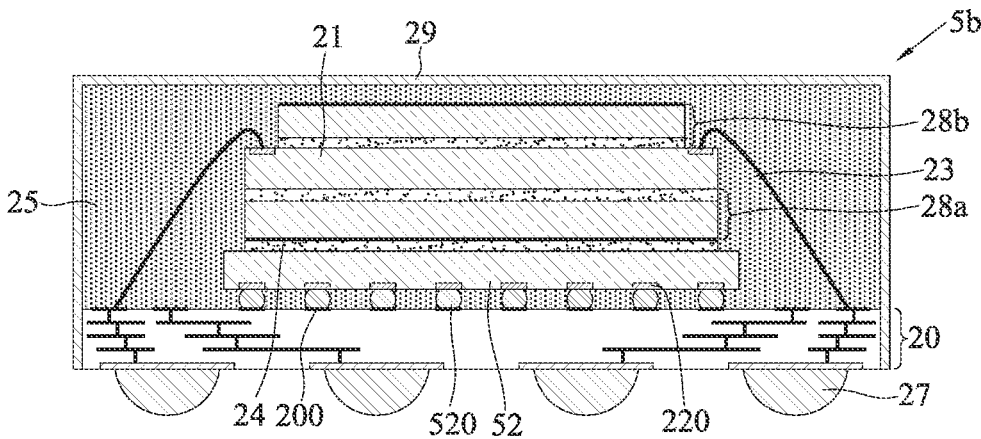

Moreover, as shown in an electronic package 5a, 5b of FIG. 5A and FIG. 5B, a second electronic component 22, 52 can be disposed on the first side 20a of the carrier structure 20 first before disposing the first shielding part 28a, and then the magnetized layer 281 of the first shielding part 28a is disposed on the second electronic component 22, 52 via the adhesive layer 24, wherein the second electronic component 22, 52 is an semiconductor chip and can be electrically connected to the circuit layer 200 on the first side 20a of the carrier structure 20 by wire bonding (such as an adhesive layer 54 and a wire 53 connected to an electrode pad 220 as shown in FIG. 5A), flip chip (such as conductive bumps 520 connected to the electrode pads 220 as shown in FIG. 5B), directly contacting the circuit layer 200, or other suitable ways without any special limitations. It can be understood that parts of a wire 530 can be electrically connected to the electrode pad 210 of the first electronic component 21 and the electrode pad 220 of the second electronic component 22, as shown in FIG. 5A. It can be understood that the first shielding part 28a can also be the shielding component of the second electronic component 22, 52 at the same time.

The present disclosure also provides an electronic package 2, 2a, 2b, 3a, 3b, 4a, 4b, 5a, 5b, comprising: a carrier structure 20 having circuit layers 200, 201, 202, an encapsulation layer 25, 35, at least one first electronic component 21, and at least one first shielding part 28a, 48a.

The first shielding part 28a, 48a is embedded in the encapsulation layer 25, 35, wherein the first shielding part 28a, 48a includes a semiconductor block 280 and a magnetized layer 281 and a bonding layer 283 formed on opposing sides of the semiconductor block 280 respectively.

The first electronic component 21 is embedded in the encapsulation layer 25, 35, bonded to the bonding layer 283 of the first shielding part 28a, 48a, and electrically connected to the carrier structure 20.

The encapsulation layer 25, 35 is formed on the carrier structure 20 to cover the first electronic component 21, the first shielding part 28a, 48a and the second shielding part 28b, 38b, 48b.

In an embodiment, the first shielding part 28a is disposed on the carrier structure 20 via a side of the magnetized layer 281 of the first shielding part 28a, so that the first shielding part 28a is located between the first electronic component 21 and the carrier structure 20.

In an embodiment, the first electronic component 21 is disposed on the carrier structure 20, so that the first electronic component 21 is located between the first shielding part 28a and the carrier structure 20.

In an embodiment, the electronic package 2, 2a, 2b, 3a, 3b, 4a, 4b, 5a, 5b further comprises at least one second shielding part 28b, 38b, 48b disposed on the first electronic component 21, wherein the second shielding part 28b, 38b, 48b includes a semiconductor block 280, and a magnetized layer 281 and a bonding layer 283 formed on opposing sides of the semiconductor block 280, such that the second shielding part 28b, 38b, 48b is disposed on the first electronic component 21 via the bonding layer 283 of the second shielding part 28b, 38b, 48b, so that the first electronic component 21 is located between the first shielding part 28a and the second shielding part 28b. Further, the first electronic component 21 is electrically connected to the circuit layer 200 of the carrier structure 20 via a plurality of wires 23. For instance, the bonding layer 283 of the second shielding part 38b covers parts of the wires 23.

In an embodiment, the first shielding part 28*a* and/or the second shielding part 28*b* further include another magnetized layer 282 formed between the semiconductor block 280 and the bonding layer 283.

In an embodiment, a top surface 35*a* of the encapsulation layer 35 is flush with a surface of the magnetized layer 281 of the second shielding part 28*b*.

In an embodiment, at least one recess 350 is formed on the encapsulation layer 35, such that the surface of the magnetized layer 281 of the second shielding part 28*b* is exposed from the recess 350.

In an embodiment, the electronic package 2, 2*a*, 2*b*, 3*a*, 3*b*, 4*a*, 4*b*, 5*a*, 5*b* further comprises a shielding layer 29 formed on the encapsulation layer 25, 35.

In an embodiment, a plurality of the first shielding parts 28*a*, 48*a* are disposed on the carrier structure 20.

In an embodiment, a plurality of the second shielding parts 28*b*, 38*b*, 48*b* are disposed on the first electronic component 21.

In an embodiment, the electronic package 5*a*, 5*b* further comprises a second electronic component 22, 52 embedded in the encapsulation layer 25, such that the first shielding part 28*a* is disposed on the second electronic component 22, 52 via the magnetized layer 281 of the first shielding part 28*a*, so that the first electronic component 21 and the second electronic component 22, 52 are disposed on opposing sides of the semiconductor block 280 of the first shielding part 28*a* respectively, the second electronic component 22, 52 is located between the carrier structure 20 and the first shielding part 28*a*, and the second electronic component 22, 52 is electrically connected to the circuit layer 200 of the carrier structure 20.

To sum up, in the electronic package of the present disclosure and manufacturing method thereof, the shielding part 28 is bonded to the first electronic component 21, so that the semiconductor block 280 separates the magnetized layer 281 and the first electronic component 21 (having magnetic field operation), such that the shielding part 28 can prevent the first electronic component 21 from being interfered by the external electromagnetic interference. Further, since the distance d1, d2 (at most 75 μm) defined by the thickness to of the single semiconductor block 280 (dummy chip) is maintained between the magnetized layer 281 and the first electronic component 21, the magnetic field operation of the first electronic component 21 can be prevented from being interfered by the magnetic field of the magnetized layer 281. Hence, compared to the prior art, the reliability of the electronic package 2, 2*a*, 2*b*, 3*a*, 3*b*, 4*a*, 4*b*, 5*a*, 5*b* of the present disclosure can be improved.

The above embodiments are set forth to illustrate the principles of the present disclosure and the effects thereof, and should not be interpreted as to limit the present disclosure. The above embodiments can be modified by one of ordinary skill in the art without departing from the scope of the present disclosure as defined in the appended claims. Therefore, the scope of protection of the right of the present disclosure should be listed as the following appended claims.

What is claimed is:

1. An electronic package, comprising:
a carrier structure;
an encapsulation layer formed on the carrier structure;
a first shielding part embedded in the encapsulation layer, wherein the first shielding part includes a semiconductor block and a magnetized layer formed on one side of the semiconductor block, and the semiconductor block is a dummy die without electrical transmission functionality; and
a first electronic component embedded in the encapsulation layer and disposed on other side of the semiconductor block, wherein the first electronic component is electrically connected to the carrier structure.

2. The electronic package of claim 1, wherein the first shielding part further comprises a bonding layer formed on the other side of the semiconductor block, and the first electronic component is bonded to the bonding layer.

3. The electronic package of claim 1, wherein the first shielding part is disposed on the carrier structure via a side of the magnetized layer of the first shielding part, and the first shielding part is located between the first electronic component and the carrier structure.

4. The electronic package of claim 1, wherein the first electronic component is disposed on the carrier structure, and the first electronic component is located between the first shielding part and the carrier structure.

5. The electronic package of claim 1, further comprising a second shielding part disposed on the first electronic component, wherein the second shielding part includes a semiconductor block and a magnetized layer formed on one side of the semiconductor block, wherein the second shielding part is disposed on the first electronic component via other side of the second shielding part, and the first electronic component is located between the first shielding part and the second shielding part.

6. The electronic package of claim 5, wherein the first electronic component is electrically connected to the carrier structure via a plurality of wires.

7. The electronic package of claim 1, further comprising a shielding layer formed on the encapsulation layer.

8. The electronic package of claim 1, wherein a plurality of the first shielding parts are disposed on the carrier structure.

9. The electronic package of claim 1, further comprising a second electronic component embedded in the encapsulation layer, wherein the first shielding part is disposed on the second electronic component via the magnetized layer of the first shielding part, wherein the first electronic component and the second electronic component are disposed on the opposing sides of the semiconductor block of the first shielding part respectively, wherein the second electronic component is located between the carrier structure and the first shielding part, and the second electronic component is electrically connected to the carrier structure.

\* \* \* \* \*